United States Patent

Gabzdyl et al.

[11] Patent Number: 5,964,861
[45] Date of Patent: Oct. 12, 1999

[54] METHOD FOR WRITING A PROGRAM TO CONTROL PROCESSORS USING ANY INSTRUCTIONS SELECTED FROM ORIGINAL INSTRUCTIONS AND DEFINING THE INSTRUCTIONS USED AS A NEW INSTRUCTION SET

[75] Inventors: Rebecca Gabzdyl; Brian McGovern, both of Surrey, United Kingdom

[73] Assignee: Nokia Mobile Phones Limited, Salo, Finland

[21] Appl. No.: 08/767,644

[22] Filed: Dec. 17, 1996

[30] Foreign Application Priority Data

Dec. 22, 1995 [GB] United Kingdom .................... 9526457

[51] Int. Cl.[6] ....................................................... G06F 9/00
[52] U.S. Cl. ............................... 712/23; 712/209; 712/210
[58] Field of Search ......................... 395/800.01, 800.23, 395/800.24, 800.28; 712/208, 209, 210

[56] References Cited

U.S. PATENT DOCUMENTS

| | | | |
|---|---|---|---|
| 4,994,960 | 2/1991 | Tuchler et al. | 710/269 |
| 5,289,059 | 2/1994 | Pikkarainen | 307/520 |
| 5,365,119 | 11/1994 | Kivari | 327/115 |
| 5,387,874 | 2/1995 | Rapeli | 327/337 |
| 5,390,223 | 2/1995 | Lindholm | 377/49 |
| 5,416,435 | 5/1995 | Jokinen et al. | 327/113 |
| 5,481,683 | 1/1996 | Karim | 395/393 |
| 5,497,116 | 3/1996 | Rapeli | 327/337 |
| 5,509,129 | 4/1996 | Guttag et al. | 395/393 |
| 5,568,646 | 10/1996 | Jaggar | 395/385 |
| 5,581,776 | 12/1996 | Hagqvist et al. | 395/590 |
| 5,737,625 | 4/1998 | Jaggar | 395/800 |
| 5,758,115 | 5/1998 | Nevill | 395/385 |

FOREIGN PATENT DOCUMENTS

WO 92/15939  9/1992  WIPO.

OTHER PUBLICATIONS

"The Problems of RISC–Based Designs" Gunn, L., Dialog record 01319707 of Electronic Design, v37, n24, p69, Nov. 23, 1989.

"Claculated RISC" Rosch, W.L., Dialog record 01262462 of PC–Computing, v1, n5, p172, Dec. 1988.

*Primary Examiner*—Meng-Ai T. An
*Assistant Examiner*—Mackly Monestime
*Attorney, Agent, or Firm*—Perman & Green, LLP

[57] ABSTRACT

A method for designing a processor. The method utilises the full flexibility of an original instruction set in writing programs for operation of the processor the subset of instruction words used in writing the program are then used in defining the instruction decoder of the processor.

8 Claims, 3 Drawing Sheets

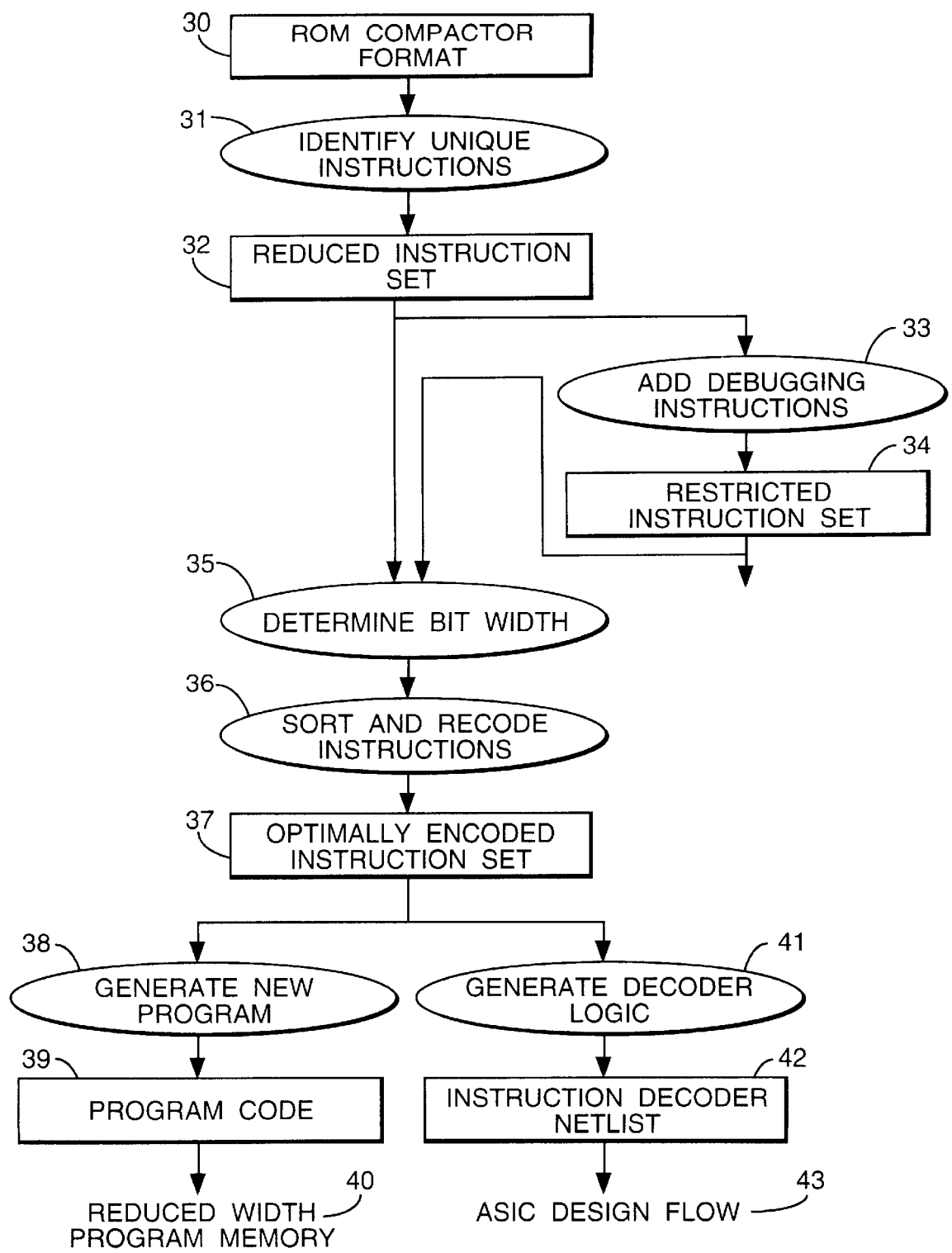

METHOD FOR WRITING A PROGRAM TO CONTROL PROCESSORS USING ANY INSTRUCTIONS SELECTED FROM ORIGINAL INSTRUCTIONS AND DEFINING THE INSTRUCTIONS USED AS A NEW INSTRUCTION SET

BACKGROUND OF THE INVENTION

The invention relates to instruction sets for processors and more particularly to a method for providing an instruction set for a processor.

General purpose processors perform functions in response to a set of instructions that form a program. This is stored in a program memory. The memory capacity required to store the program is related to the length of the instruction word and the number of instruction steps in the program.

The instructions in the program memory are used to generate parallel control signals in a decode unit that controls the operations performed by the processor. The complexity of the logic required to translate the instruction words into control is related to the length of the instruction word input to the decode unit.

In order to optimise processor performance in terms of speed and power consumption it is desirable to provide as many instructions to a software designer as possible, allowing the designer access to the full functionality of the processor.

If a fully flexible instruction word set, individually specifying each function the processor can perform is used, the designer has maximum freedom to design an optimal algorithm implementation. An efficient instruction set that allows full access to the functionality of a processor that meets future performance requirements of the telecommunications industry is far greater than 16 bits which is the current standard. For the purposes of this document a 90 bit instruction word is assumed to be suitable. Even larger instruction sets may, however, at some point be desirable resulting in even longer instruction words. With 90 bit instruction words the program memory may be as wide as 90 bits and of the order of 16 bits long to accommodate the program for implementing a typical processor algorithm for a radio telephony application.

This has the disadvantage for low cost applications that a large memory is needed to store the program as the instruction words will be 90 bits long. The interface between the program memory and the instruction decoder needs to have additional interconnects in order to allow the 90 bit instruction words to be received by the decode unit. This again adds to the size and power consumption of the processor. Finally the logic needed to implement the decode unit is increased in roughly direct proportion with the number of input pins. The decode unit is, therefore, more complex and consequently more expensive.

In battery powered consumer products where cost and power consumption are of considerable concern to the designer, a compromise needs to be made between instruction set flexibility and resulting power efficiency and instruction word length and the increased cost.

One conventional approach to resolving this conflict is to set the instruction word length by determining in advance a restricted number of instructions from which the designer is able to select. The choice of the restricted instruction set is of paramount importance and will typically be the instructions perceived to be most useful for a range of functions the processor might need to perform.

This approach has the disadvantage that if the restricted instruction set does not include a particular instruction or the building blocks of that instruction, although the processor has hardware capable of functioning in accordance with that instruction it will be unable to operate in that fashion. This can lead to design compromises that may reduce the efficiency of the device the processor is driving and make the required performance of the device controlled by the processor difficult to achieve.

If the instruction set does not include a particular instruction, it may still be possible to create the same instruction by combining a number of other instructions. This will inevitably result in more power being consumed in providing the desired performance than if the desired instruction had formed part of the restricted instruction set.

SUMMARY OF THE INVENTION

In accordance with the present invention there is provided a method for designing a processor operable in response to control signals generated by programs composed from instruction words, the processor being capable of performing a set of functions and operable to perform each of the set of functions in response to a respective control word, each control word being correlated with a respective instruction word of an original instruction set, the method comprising, writing a program operable to control the processor using instructions selected from the original instruction set, selecting a subset of instruction words from the original instruction set comprising the instructions used in the program, renaming the respective instructions of the subset and providing means for generating the respective control words correlated with the instruction words of the subset in response to the corresponding renamed instruction words.

By selecting the reduced instruction set that the processor is to use with the foreknowledge of the program the processor will run, there is no need to compromise between instruction word length and performance. The performance is the same as is possible using the original instruction set as the selection of words for the program is made from that set. The word length can, however, be as short as is possible for the number of individual words in the program the processor will run.

The reduced instruction word length enables the instruction decoder to be simpler reducing component count and cost and power consumption. The program memory needed to store the operating algorithm is also reduced in terms of both width of the renamed instruction word and length as a result of the more succinct expression of the functionality of the processor.

Once the instruction decoder has been designed there is no opportunity to add extra instructions to the processor. If the code words that represent an instruction, or the building blocks of an instruction, do not exist a function cannot be performed. To give the designer some flexibility once the processor has been developed the subset of instruction words may include additional instruction words corresponding to potentially useful control words. These additional instructions may include those useful in correcting typical errors in the program or may include some basic instructions to allow other functions to be supported.

Once the number of individual instruction words in the program has been determined the shortest word length to enable those instructions to be individually labelled can be set. It is likely that there will be some spare words once the subset of instruction words have been renamed using the shortest possible word length. The number of words that are not needed to uniquely identify the subset of instruction words may be sufficiently large that these can be used to support the additional instructions. This redundancy could, however, be exploited to simplify the logic of the means for generating the respective control words. A longer renamed instruction word than the minimum necessary to uniquely identify the respective instruction words of the subset may be utilised to build in some redundancy to enable the complexity of the logic to be reduced.

Methods in accordance with the invention have the advantage that the programmer can achieve optimal performance as the programmer can use a fully flexible instruction set. In theory there is no limit to the number of instructions that can be provided in the first instruction set other than the functions the processor can perform. The limiting factor on the width of the memory of the program memory and the size of the instruction decoder is the number of unique instructions used in implementing the algorithm.

Both length and width of the program memory and the size of the instruction decoder are minimised giving cost and power advantages. The process can be automated once the program has been determined so it can be integrated into existing design processes and can easily be repeated for a series of different programs to give a series of processors with optimised instruction sets if desired.

The reduced memory and reduced size instruction decoder enable the power consumption of the device to be reduced for a given performance.

For programs likely to use a large number of common instructions a single processor could be developed for running a number of different programs. The subset of instruction words could then be determined using several programs to be used for plural applications. The word length necessary to support the respective functions would have to be considered and these would need to be balanced against advantages in commonality. However, the advantages of the present invention would be maintained as the subset of instructions operable to control the processor would be determined with the full advance knowledge of the programs the processor would be required to run.

BRIEF DESCRIPTION OF THE DRAWINGS

A method in accordance with the invention will now be described, by way of example, with reference to the accompanying drawings, in which:

FIG. 3 is a flow chart of the ROM compaction process of an embodiment of the invention.

DETAILED DESCRIPTION OF THE INVENTION

One of the uses of methods in accordance with the present invention is in designing an Digital Signal Processor (DSP). The invention will be described in relation to the design of a DSP for the baseband algorithms of a radio telephone.

Figure 1:
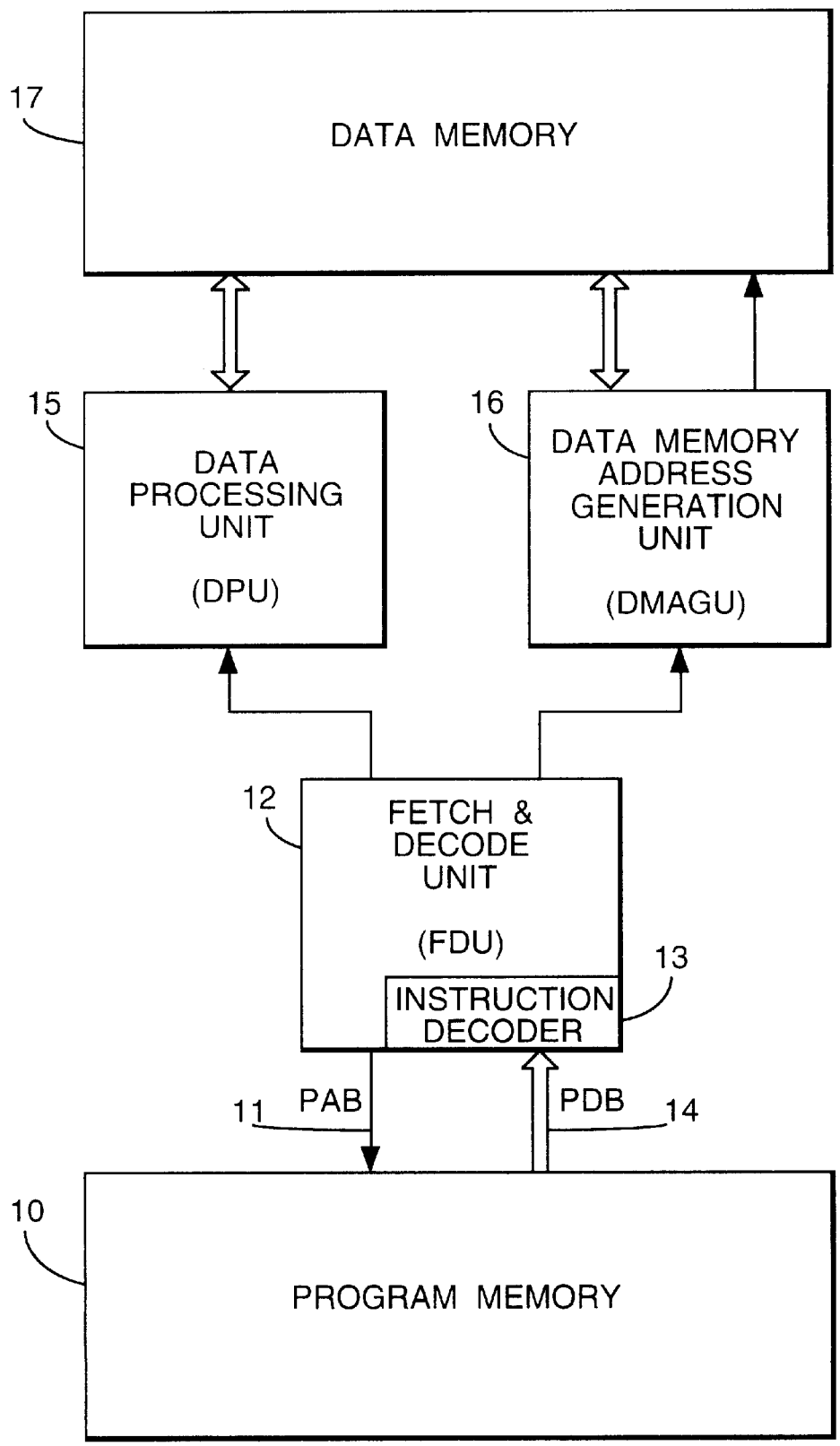
FIG. 1 is a processor core block diagram.

FIG. 1 shows an overview of the DSP architecture. A program written by DSP engineers is stored in a program memory PROM 10. A program address is typically specified on a 16 bit program address bus (PAB) 11 by a Fetch and Decode Unit (FDU) 12.

The instruction at that location in the program memory is loaded into the instruction decoder 13 of the FDU 12 via the Program Data Bus (PDB) 14. In a fully flexible (ie one that supports a full instruction set) conventionally designed DSP device, the PDB 14 may need to be, for example, 90 bits wide.

Instructions loaded into the instruction decoder 13 are decoded to generate control words ie signals necessary to control the data processing unit (DPU) 15, the Data Memory Address Generation Unit (MAGU) 16 which addresses data memories contents 17, FDU or bus accesses to provide data for the program.

A prior art DSP and a DSP generated in accordance with the present invention will not operate in a different manner. A DSP generated in accordance with the present invention will however, have a smaller program memory 10, a reduced width PDB 14, and a smaller instruction decoder 13 within the FDU 12 than a conventional DSP providing the same functionality.

One method in accordance with the present invention that generates a digital signal processor for a radio telephone with the above advantages will be described below with reference to FIGS. 2 and 3.

As with prior art methods the baseband algorithms must be coded, ie the program or programs must be written. However, whereas in prior art methods a decision will have already been made at this stage vis a vis the trade-off between the instruction set available to the programmer and the instruction word length acceptable, the designer will, in accordance with the present invention, have access to a full instruction set.

Figure 2:
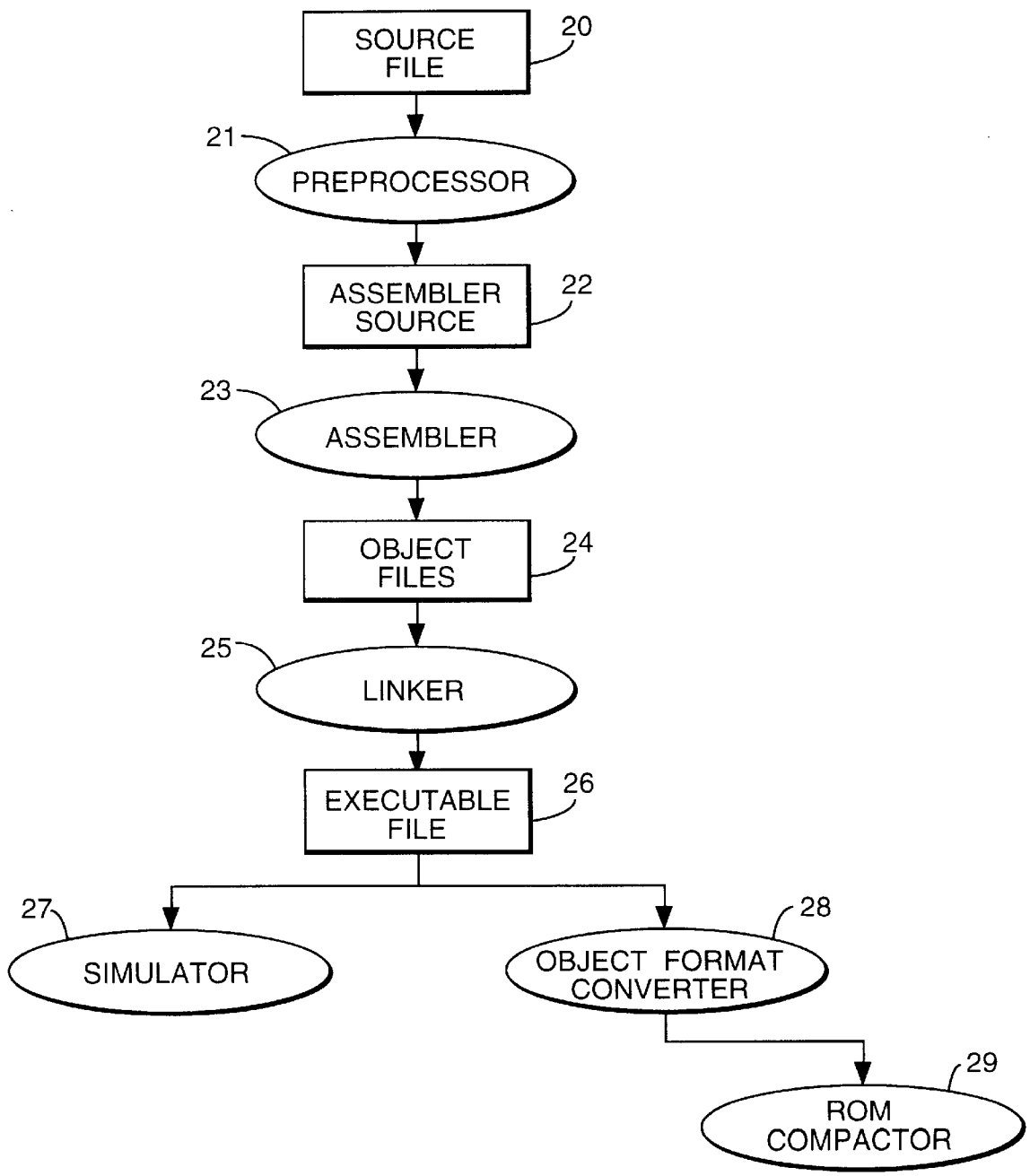
FIG. 2 is a Software Development flow chart.

A design method in accordance with the present invention is illustrated in FIG. 2. As an initial step, the source file is written. The source file is a text file entered into the computer by the programmer. The text file consists of assembly language instructions and high level macro "instructions", which are predefined functions written in assembly language. The pre-processor 21 then automatically translates any macro instructions into assembler source 22 which are assembly language instructions. The assembler 23 then translates the assembly language source file, which is understandable by the programmer, into object files 24, which are understandable by the processor. For a large DSP application it is likely that the program will be split into several source files. A linker 25 takes all corresponding object files and links them to form one executable file 26.

Once the algorithms for the executable file have been coded they will be simulated in a simulator 26 and their correctness verified. The code is then frozen. In one embodiment of the present invention no changes would be made to the coded algorithms after this point as the instruction set available for use is now defined. An example will, however, be discussed later to indicate how changes to the algorithm can still be made after this stage although ideally no further changes would be necessary.

Once the algorithm has been verified, the object format converter 28 converts the executable file 26 into a format that can be used to generate the program memory. Further stages of the process can then be followed using a tool called for the purposes of this description a ROM compactor 29 to enable only those instructions used in the algorithms to be supported by the DSP.

The executable file 26, which is the output from the linker 25, is converted into a format that the ROM compactor can use 30 via the object format converter 28.

For a program or algorithm of typical length for a radio telephony application around 25,000 of the available $2^{90}$ instruction sets will be used. In order to uniquely identify each of the $2^{90}$ instructions an 90 bit word length is required. The actual 25,000 individual words could be specified using an 16 bit word. In general $2^N$ words can be uniquely identified using an N bit word. There is no correlation between the number of instructions the fully flexible instruction set provides and the number of instructions used in coding the algorithm. If we imagine an algorithm coded using 25,000 lines of code, there will be at most 25,000 individual instructions used. Some instructions will almost inevitably be used more than once. Any duplication will result in a reduction in the number of unique instructions used to write the code.

The program is analysed and each individual instruction word used in the program noted 31. Instructions not used in the in program are ignored. The result is a reduced instruction set 32 that contains only instructions actually used in the program. If required, a subset of instructions that may be useful for debugging programs can be added to the reduced instruction set 33 to give a restricted instruction set 34.

It may also be desirable to include further subsets of the original instruction set that may be used if any changes to the program are made. Naturally each time a desirable subset of instructions is considered the list of instructions in the program will be checked to avoid duplication of instructions. The designer will also have to decide whether the benefits outweigh the disadvantages if the inclusion of additional instructions requires an additional line to be added to the PDB and a consequential extra pin to the instruction decoder or removes some of the redundancy sueful in simplifying the design of the instruction decoder. However, by starting from the set of instructions actually used in coding an algorithm the full freedom in design of the fully flexible set has been utilised and there is no trade off between performance and word length. Additional instructions added to the capability of the processor can be used for some degree of flexibility after the algorithm has been coded. Any changes are more than likely to be restricted to correction of errors and additional instructions can be chosen with that in mind.

Next the ROM compactor determines the bit width N, required 35. This is determined by examining the total number of instructions in the reduced or restricted instruction set. The bit width is the width of the words that will be used to rename the reduced or restricted instruction sets used to encode the instructions.

The instructions are then sorted to group similar instructions together. Each of the instructions is correlated with a control word that provides the signals for controlling the function of the DSP. Once the set of instructions utilised in the program has been identified these can be given a respective prefix. This enables the instructions to be easily sorted so that similar instructions are placed together to minimise the resulting logic in the instruction decoder.

To minimise the decoder logic further, any redundancy resulting from the number of instructions being less than $2^N$ is used in this sorting process. The word width selected may need some additional in-built redundancy to allow the logic of the instruction decoder 13 to be kept simple. The bit width selected may accordingly be longer than the minimum necessary to uniquely identify the reduced or restricted instruction set.

Once sorted, the instructions are encoded using consecutive binary numbers 36. Simply, the new instruction word could be the line on the sorted list of unique instructions. This results in an optimally encoded instruction set 37. The executive file 26 is then automatically rewritten 38 by replacing the old instruction words with the corresponding new instruction words to generate a new program code 39 which can be stored in a reduced width program memory 40. The program memory can be addressed in conventional fashion using a 16 bit address bus. However, the Program Data Bus, instead of being 80 or 90 bits as would have been necessary if the program was written using the original instruction set, will instead be 15 or 16 bits long depending on the amount of duplication in the program.

In order for the program to be implemented, an instruction decoder that provides control words correlated to the respective new instruction words is needed. The instruction decoder is a logic unit that provides the correlated control word output in response to the input of a respective one of the new instruction words.

The decoder logic is generated 41 by correlating each new instruction word with the control word associated with the old instruction word. The inputs and outputs of an instruction decoder are thus specified. Hardware description languages are available to specify the inputs and outputs of an instruction decoder. These are then used in conjunction with a tool such as Synopsys to determine a suitable logic arrangement for the instruction decoder. This tool generates an Instruction decoder netlist 42 providing an Application Specific Integrated Circuit (ASIC) Design flow 43 for generating the logic for the instruction decoder. Once a layout for the instruction decoder has been determined this can be manufactured along with the other circuitry of the fetch and decode unit and the program memory. The various blocks of the DSP will typically be integrated on an ASIC.

In another embodiment, instead of designing a processor dedicated to a specific application, a processor able to run two or more programs with a high degree of commonality; that is programs using a large core of similar instructions could be designed.

The present invention includes any novel feature, combination of features or subset of features disclosed herein either explicitly or any generalisation thereof irrespective of whether or not it relates to the claimed invention or mitigates any or all of the problems addressed.

In view of the foregoing description it will be evident to a person skilled in the art that various modifications may be made within the scope of the invention in particular the invention is applicable for use in the design of processors for devices other than radio telephones.

What is claimed is:

1. A method for producing a processor operable in response to control signals generated by programs composed from instruction words, the processor being capable of performing a set of functions and operable to perform each of the set of functions in response to a respective control word, each control word being correlated with a respective instruction word of an original instruction set, the method comprising the steps of:

writing a program operable to control the processor using any instructions selected from the original instruction set, defining instructions used in the program as a new instruction set such that the new instruction set is a subset of the original instruction set renaming the respective new instruction words of the subset, and providing means for generating the respective control words correlated with the instruction words of the new subset in response to the corresponding renamed instruction words.

2. A method according to claim 1 wherein the program formed from the renamed instruction words is stored in a program memory.

3. A method according to claim 1 wherein the step of generating comprises using an instruction decoder.

4. A method according to claim 1 wherein the functionality of the processor is confirmed using an application coded in the original instruction set.

5. A method according to claim 1 wherein the subset of instruction words comprise instructions for performing functions desirable for correcting errors.

6. A method according to claim 1 wherein the renamed instruction words are of minimum length such that each instruction word of the subset is uniquely identifiable.

7. A method according to claim 1 wherein the renamed instruction words are longer than the minimum length for each instruction word of the subset to be uniquely identifiable.

8. A method according to claim 3 wherein the step of generating minimizes the size of the instruction decoder.

* * * * *